(12) United States Patent
Timopheev et al.

(10) Patent No.: US 12,102,011 B2
(45) Date of Patent: Sep. 24, 2024

(54) MAGNETIC SENSOR COMPRISING MAGNETORESISTIVE ELEMENTS AND SYSTEM FOR PROGRAMMING SUCH MAGNETIC SENSOR

(71) Applicant: Allegro MicroSystems, LLC, Manchester, NH (US)

(72) Inventors: Andrey Timopheev, Vif (FR); Nikita Strelkov, Meylan (FR); Jeffrey Childress, San Jose, CA (US)

(73) Assignee: Allegro MicroSystems, LLC, Manchester, NH (US)

( * ) Notice: Subject to any disclaimer, the term of this patent is extended or adjusted under 35 U.S.C. 154(b) by 150 days.

(21) Appl. No.: 17/999,578

(22) PCT Filed: May 27, 2021

(86) PCT No.: PCT/IB2021/054647
§ 371 (c)(1),
(2) Date: Nov. 22, 2022

(87) PCT Pub. No.: WO2021/240432
PCT Pub. Date: Dec. 2, 2021

(65) Prior Publication Data
US 2023/0292624 A1 Sep. 14, 2023

(30) Foreign Application Priority Data
May 28, 2020 (EP) .................................... 20315270

(51) Int. Cl.
*H10N 50/10* (2023.01)
*H10N 50/80* (2023.01)

(52) U.S. Cl.
CPC ............. *H10N 50/10* (2023.02); *H10N 50/80* (2023.02)

(58) Field of Classification Search
CPC ........ H10N 50/10; H10N 50/80; H10N 59/00; B82Y 15/00; B82Y 20/00; H01F 10/3254;
(Continued)

(56) References Cited

U.S. PATENT DOCUMENTS

| 2011/0111133 A1 | 5/2011 | Zhou et al. |
| 2015/0132503 A1 | 5/2015 | Kautzky et al. |

(Continued)

OTHER PUBLICATIONS

International Search Report issued in Application No. PCT/IB2021/054647 dated Aug. 9, 2021.
(Continued)

*Primary Examiner* — Jermele M Hollington
*Assistant Examiner* — Zannatul Ferdous
(74) *Attorney, Agent, or Firm* — DALY, CROWLEY, MOFFORD & DURKEE, LLP (57) ABSTRACT

A magnetic sensor including a plurality of magnetoresistive elements; each magnetoresistive element including a ferromagnetic layer having a magnetization that is orientable at or above a threshold temperature; the magnetic sensor further includes a plasmonic structure destined to be irradiated by electromagnetic radiation and including a spatially periodic plasmonic array of metallic structures. The period of the plasmonic array and the lateral dimension of the metallic structures are adjusted to obtain plasmon resonance of the plasmonic structure for a given wavelength of the electromagnetic radiation. The plasmonic array is arranged in the magnetic sensor such as to heat the first ferromagnetic layer at or above the threshold temperature, from the enhanced absorption of the electromagnetic radiation by plasmon resonance. The present disclosure further concerns a system including the sensor and an emitting device configured to emit electromagnetic radiation.

15 Claims, 5 Drawing Sheets

(58) Field of Classification Search
CPC ... G11B 5/3163; G11B 5/3909; G11B 5/3948; H10B 61/00; G01R 33/0052; G01R 33/0094; G01R 33/098; G01R 33/0005
See application file for complete search history.

(56) References Cited

U.S. PATENT DOCUMENTS

2019/0066719 A1\* 2/2019 Macken .............. G11B 5/3106
2021/0359200 A1\* 11/2021 Lee ...................... H10B 61/22

OTHER PUBLICATIONS

Written Opinion for PCT/IB2021/054647 dated Aug. 9, 2021.
European Search Report issued in Application No. EP20315270.7 dated Nov. 6, 2020.

\* cited by examiner

MAGNETIC SENSOR COMPRISING MAGNETORESISTIVE ELEMENTS AND SYSTEM FOR PROGRAMMING SUCH MAGNETIC SENSOR

CROSS-REFERENCE TO RELATED APPLICATIONS

This application is a national phase of PCT/IB2021/054647 filed on May 27, 2021, which claims the priority of European Application No. 20315270.7, filed on May 28, 2020. The entire contents of these applications are hereby incorporated by reference in their entireties.

FIELD

The present invention relates to magnetic sensors comprising magnetoresistive elements and a system for programming such magnetic sensors.

DESCRIPTION OF RELATED ART

Magnetic sensor based on magnetic tunnel junction (MTJ) technology outperforms GMR, AMR and Hall effect sensors by several essential parameters such as sensitivity, die size etc. Full performance of TMR sensor can be reached with a Wheatstone bridge configuration where diagonal branches are programmed in the same direction while those constituting each half bridge—in the opposite. Therefore, Wheatstone bridge configuration requires a sequential programming of different sensor branches under different magnetic field directions.

Among other technologies, laser programming is an effective tool to deliver high energy densities on a micron sized spot. Another advantage is that it allows to program entire wafer in a few tens of minutes. All this has direct impact on the final product cost and therefore at least partially defines its success on the market.

However, effectiveness of laser programming is strongly dependent on a complete sensor layout design. Usual tunnel magnetoresistive (TMR) sensor contains an array of MTJ stacks connected with certain serial to parallel ratio. Metallic layers serve as interconnectors within MTJ array and as well as electric leads to outer periphery. They therefore partially or completely hide an MTJ stack from the direct exposure to a laser beam. Moreover, metals do not absorb much in the visible/near infrared region. Therefore, all the metallic layers work as mirrors reflecting the laser energy rather than absorbing it. This makes the absorption of the energy non uniform (in the first approximation it depends on surface density of metal) over the sensor area and quite inefficient.

Document US2011111133 discloses a method by which portions of a wafer level fabrication can be selectively heated by means of the formation of a plasmon generating layers of specific size, shape, orientation and material on the fabrication and then illuminating the formation with electromagnetic radiation of such wavelength and polarization as will optimally be absorbed by the plasmon generating layers so as to generate plasmons therein. The generated plasmons thereupon produce thermal energy which is transferred to portions of the fabrication with which the plasmon generation layer has thermal contact.

Document US2015132503 discloses methods of forming a near field transducer, the method including depositing a plasmonic material; and laser annealing the plasmonic material.

SUMMARY

Plasmonic resonance is well-known and established effect which happens in metallic structures with developed micron to sub-micron texture. The effect has overcome the in-lab environment and gets employed in real life applications, namely heat-assisted programming of high-coercive recording media, absolute or selective absorber layers for optical sensing, laser color printing on the metal, etc. Resonance absorption in plasmonic structure can be adjusted to laser beam polarization and its wavelength by design of the texture characteristic dimensions, such as size of the elements, their shape and their relative distance.

The present disclosure concerns a magnetic sensor comprising a plurality of magnetoresistive elements. Each magnetoresistive element comprises an MTJ including a first ferromagnetic layer having a first magnetization switchable in accordance to an external magnetic field above a threshold temperature.

The magnetic sensor further comprises a plasmonic structure destined to be irradiated by electromagnetic radiation. The plasmonic structure comprises a spatially periodic plasmonic array of metallic structures, the period of the plasmonic array and the lateral dimension of the metallic structures being adjusted to obtain plasmon resonance of the plasmonic structure for a given wavelength of the electromagnetic radiation. The plasmonic array is arranged in the magnetic sensor such as to heat the first ferromagnetic layer at the threshold temperature, from the enhanced absorption of the electromagnetic radiation by plasmon resonance.

The magnetic sensor comprises an array of sensor branches, each sensor branch comprising a plurality of magnetoresistive elements. The plasmonic structure comprises a plurality of plasmonic subarrays, each plasmonic subarray comprising a periodic array of metallic structures and being arranged in alternance with the sensor branches.

The plasmonic structure comprises at least a first plasmonic subarray and a second plasmonic subarray having a different resonance response from the first plasmonic subarray with respect to the polarization or wavelength of the electromagnetic radiation.

The present disclosure further concerns a system comprising the magnetic sensor and an electromagnetic radiation emitting device configured to emit electromagnetic radiation that irradiates an illuminated region of the magnetic sensor and that has a wavelength adapted to generate plasmon resonance of the plasmonic structure.

The magnetic sensor disclosed herein can be programmed by using an electromagnetic radiation and provide efficient absorption of the light energy at the MTJs. The different metallic layers can be used for absorbing the light energy. Absorption of the light energy is also more uniform.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 1:
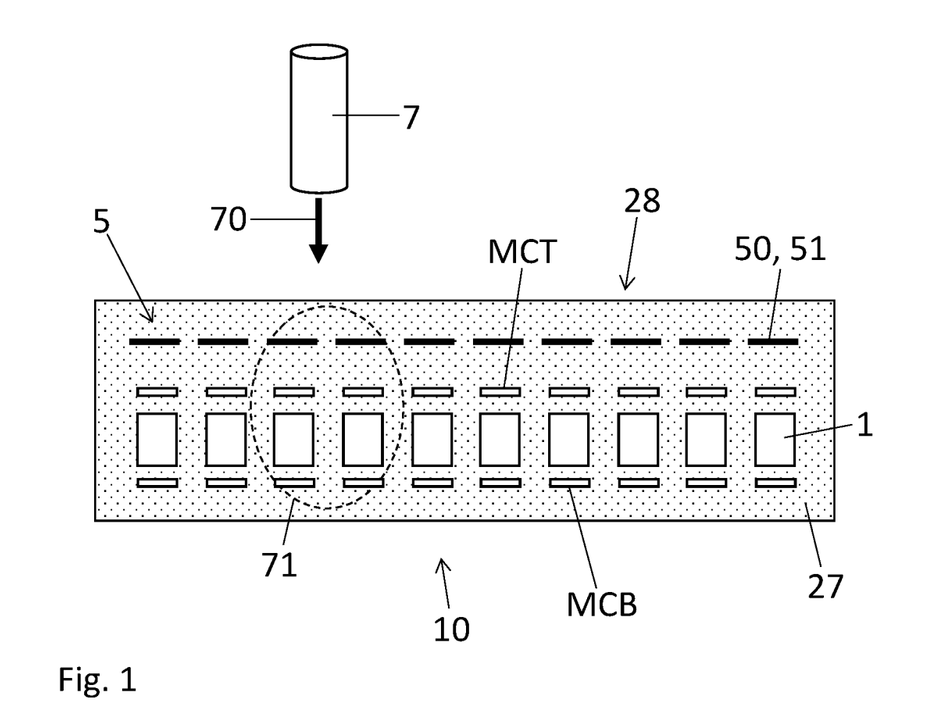
FIG. 1 shows a side view of a magnetic sensor comprising a plurality of magnetoresistive elements and a plasmonic structure, according to an embodiment.
Figure 2:
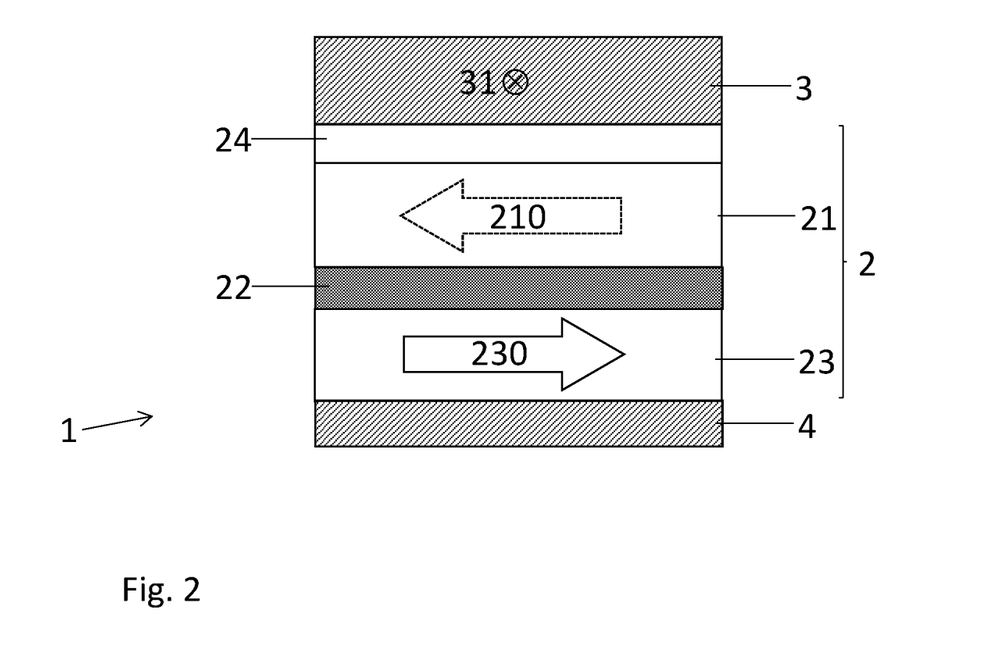
FIG. 2 shows a side view of an isolated magnetoresistive element, according to an embodiment.

FIG. 1 shows a side view of a magnetic sensor 10 comprising a plurality of magnetoresistive elements 1, according to an embodiment. FIG. 2 shows a side view of an isolated magnetoresistive element 1, according to an embodiment.

As shown in FIG. 2, the magnetoresistive element 1 can comprise a MTJ 2 including a first ferromagnetic layer 21 having a first magnetization 210, a second ferromagnetic layer 23 having a second magnetization 230 that can be switched relative to the first magnetization 210. A tunnel barrier layer 22 is comprised between the first ferromagnetic layer 21 and the second ferromagnetic layer 23. The first magnetization 210 can be switchable in accordance to an external magnetic field when the MTJ 2 is heated at a temperature equal or above a threshold temperature such as a blocking temperature, a Neel temperature, or another threshold temperature. The first magnetization 210 becomes pinned at a temperature below the threshold temperature. The threshold temperature can be above 150° C. or 200° C. or at least above temperature of normal conditions of use of the magnetoresistive element 1. Below the threshold temperature, the first magnetization 210 is pinned and its direction remains stable for temperatures and external magnetic fields corresponding to normal conditions of use of the magnetoresistive element 1.

The MTJ 2 can further comprise a pinning layer 24, such as an antiferromagnetic layer, adjacent to the first ferromagnetic layer 21. The pinning layer 24 pins the first magnetization 210 along a pinned direction through exchange coupling at a temperature below the threshold temperature. Here, the threshold temperature can correspond to a temperature close to the Neel temperature and, at the same time, above the blocking temperature of the antiferromagnetic material of the antiferromagnetic layer 24.

As illustrated in FIG. 1, the magnetoresistive element 1 can be embedded in a dielectric layer 27.

Figure 3:
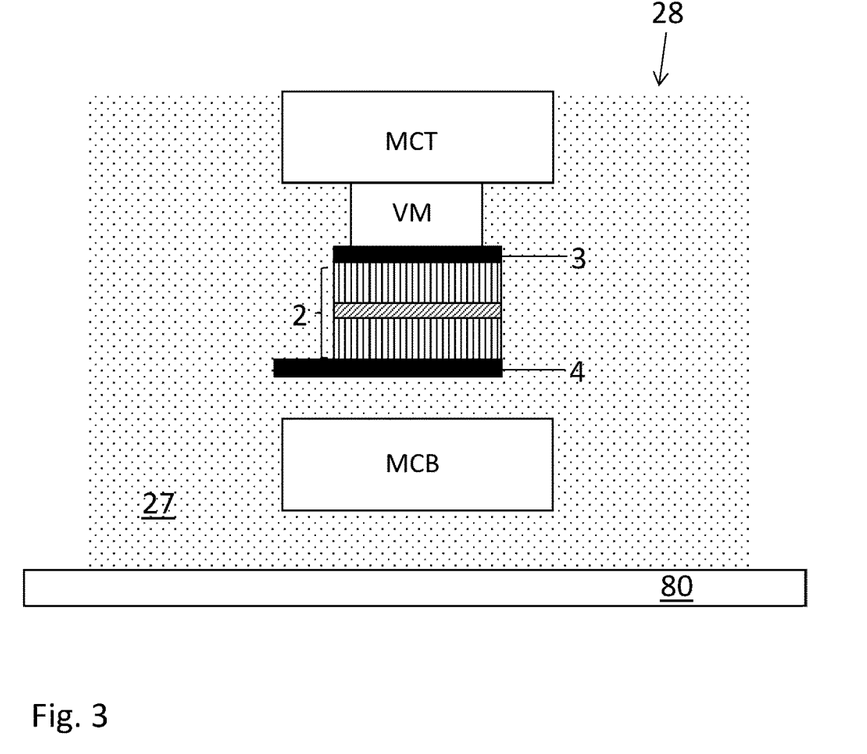
FIG. 3 represents a topology of the magnetic sensor showing one MTJ atop a silicon-based CMOS front-end circuit.

FIG. 3 represents a topology of the magnetic sensor 10 showing a top surface 28, a top metal connector layer MCT, a first current line 3, the MTJ 2, a second current line 4 and a silicon based complementary metal oxide semiconductor (CMOS) front-end circuit 80.

The magnetoresistive element 1 can further comprise metallic conductors to provide write and read functionality. In the example of FIG. 3, the first current line 3 can be electrically coupled to the magnetoresistive element 1. The second current line 4 can extend substantially perpendicular (or parallel) to the first current line 3 and being magnetically coupled to the magnetoresistive element 1. The magnetoresistive element 1 can further include a selection transistor (not show) electrically connected to the magnetoresistive element 1. The magnetoresistive element 1 can further include a top metal connector layer MCT on top of the MTJ 2 and connected to it by a metal via VM, and a bottom metal connector layer MCB below the MTJ 2. The top metal connector layer MCT electrically connect the bottom metal connector layer MCB can be used as a field line.

The magnetoresistive element 1 further comprises a plasmonic structure 5 configured to enhance and localize electromagnetic radiation 70 energy absorption emitted from an electromagnetic radiation emitting device 7.

In one aspect, the plasmonic structure 5 comprises a spatially periodic plasmonic array 50 of metallic structures 51. As shown in FIGS. 4a to 4c, the periodic plasmonic array 50 can comprise a spatially periodic arrangement of rectangular-shaped metallic structures 51 (FIG. 4a), disc-shaped metallic structures 51 (FIG. 4b) or elliptically shaped metallic structures 51 (FIG. 4c). Other shapes of the metallic structures 51 can be also contemplated.

The metallic structures 51 comprised in the plasmonic array 50 may all have substantially the same shape. However, the plasmonic array 50 may comprise metallic structures 51 having different shapes.

Principle of the Plasmonic Structure

During a programming operation of the magnetic sensor 10, the first magnetization 210 is switched from an initial orientation to a programmed orientation. The programmed orientation can be any direction in accordance to the external magnetic field direction. The programming operation can be performed on all the magnetoresistive elements 1 in the magnetic sensor 10 or a selected sub-ensemble of the magnetoresistive elements 1.

During the programming operation, the electromagnetic radiation 70 emitted by the electromagnetic radiation emitting device 7 irradiates an illuminated region 71 of the magnetic sensor 10. As shown in FIG. 1, the illuminated region 71 can cover a surface area encompassing two adjacent magnetoresistive elements 1. However, the illuminated region 71 could cover a surface area encompassing a single magnetoresistive element 1, a sub-ensemble of the magnetoresistive elements 1 or all the magnetoresistive elements 1 in the magnetic sensor 10.

In conditions of plasmon resonance of the plasmonic structure 5 at the wavelength of the electromagnetic radiation 70, the plasmonic structure 5 provides enhanced absorption of the electromagnetic radiation 70. Consequently, in the illuminated region 71, the the plasmonic structure 5 provides enhanced heat generation. The enhanced heat is transmitted to the selected magnetoresistive elements 1 in the illuminated region 71 allowing the first ferromagnetic layer 21 of the selected magnetoresistive elements 1 to be heated at or above the threshold temperature. Since the enhanced heating occurs only in the illuminated region 71, selective and mask-free programming of the magnetic sensor 10 can be achieved.

The plasmonic structure 5 can further provide a uniform heat generation within the illuminated region 71.

The radiation emitting device 7 may comprise a laser emitting device directing a focused laser beam 70 to the illuminated region 71 of the magnetic sensor 10 (see FIG. 1). The focusing of the laser beam 70 may be achieved by using near-field optics such as a solid immersion lens.

Arrangement of Array of Metallic Structures

Figure 4:
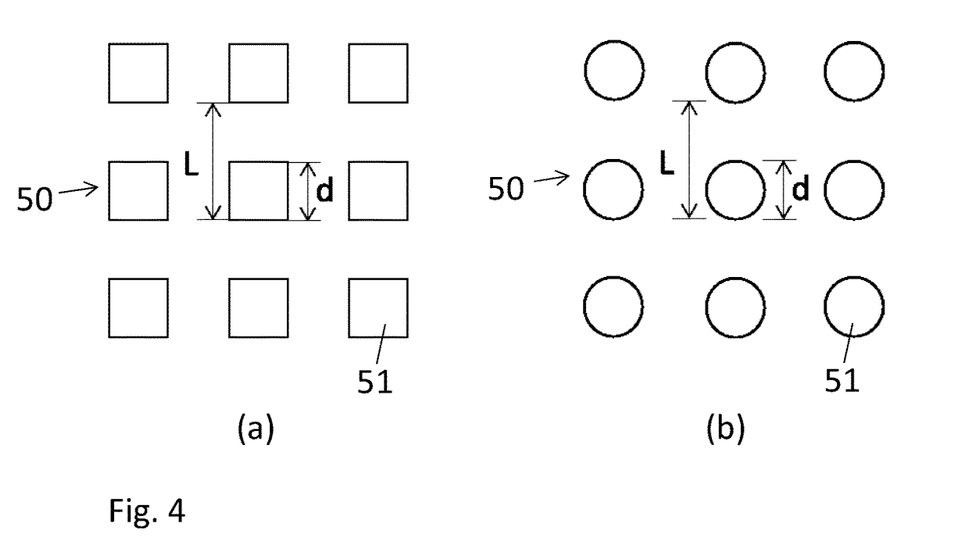
FIGS. 4a to 4c show periodic plasmonic arrays comprising rectangular-shaped metallic structures (FIG. 4a), disc-shaped metallic structures (FIG. 4b) and elliptically shaped metallic structures (FIG. 4c), according to an embodiment.

The arrangement of the metallic structures 51 in the periodic plasmonic array 50 can be optimized such as to obtain plasmonic resonance at the wavelength of the electromagnetic radiation 70. This can be achieved by varying lateral dimension d of the metallic structures 51 and the periodic arrangement of the metallic structures 51. The plasmonic array 50 can comprise a two-dimensional lattice having substantially equal the distance L between two adjacent metallic structures 51. The plasmonic array 50 can comprises any one of a square lattice (as shown in FIG. 4), rectangular lattice, hexagonal lattice or rhombic lattice of metallic structures 51, or any other type of lattice.

For example, the distance L between two adjacent metallic structures 51 in the periodic plasmonic array 50 should be equal or smaller than the wavelength of the electromagnetic radiation 70 (subwavelength plasmonic array 50). The lateral dimension d of the metallic structures 51 should also be smaller than the wavelength of the electromagnetic radiation 70 (subwavelength metallic structures 51).

Under resonance conditions, i.e., when the wavelength of the electromagnetic radiation 70 matches the plasmonic resonance of the metallic structures 51, the power absorption in metallic structures 51 can be increased by at least one order of magnitude. Under resonance conditions, the heat generation within the illuminated region 71 can reach up to 9 times the heat generation without plasmonic resonance.

Location of the Plasmonic Structure

The plasmonic structure 5 should be arranged in the magnetic sensor 10 in order to be near the magnetoresistive element 1 such that the heat absorbed by the plasmonic structure 5 in the illuminated region 71 can be transmitted to the MTJ 2 such that the reference magnetization at can be the high temperature threshold. Here, near the magnetoresistive element 1 can comprise a distance between 50 nm and 5000 nm.

The plasmonic structure 5 should further be arranged in the magnetic sensor 10 such as to be easily illuminated by the radiation emitting device 7. Ideally, the plasmonic structure 5 should not be masked from the radiation emitting device 7 by metal connector layers or other structures not participating in the plasmon resonance.

In one embodiment, the plasmonic structure 5 is provided between the top surface 28 of the magnetic sensor 10 and at least one of the MTJs 2.

Figure 5:
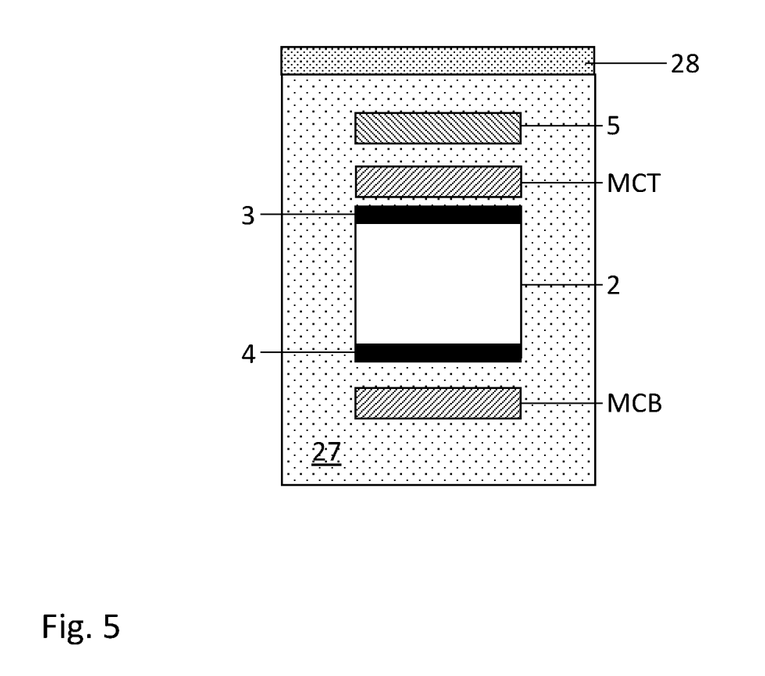
FIG. 5 shows the plasmonic structure located on top of the magnetoresistive elements and on top of the top metal connector layer, according to an embodiment.

FIG. 5 shows a partial view of the topology representation of FIG. 4. In the example shown of FIG. 5, the plasmonic structure 5 is provided between the top surface 28 and the top metal connector layer MCT. The plasmonic structure 5 can be embedded in the dielectric layer 27. The dielectric layer 27 should be optically transparent to the electromagnetic radiation 70. The dielectric layer 27 can comprise a dielectric material such as $SiO_2$, SiN, etc.

An advantage of the configuration of FIG. 5, where the plasmonic structure 5 is located on top of the magnetoresistive elements, is that the plasmonic structure 5 is not shadowed by metallic layers on a higher level. The configuration of FIG. 5 ensures uniform illumination over the whole surface of the plasmonic structure 5.

The lateral dimension of the metallic structures 51 can correspond to about the ratio of the wavelength of the electromagnetic radiation 70 to the refractive index of the dielectric layer 27, i.e. wavelength 2 of the electromagnetic radiation 70 in the dielectric layer 27, or a fraction of this ratio.

For example, in case the dielectric layer 27 comprises SiN, an incident wavelength $\lambda_i$ of 1064 nm of the emitted electromagnetic radiation 70 decreases in the dielectric layer 27 and the wavelength in SiN $\lambda_{SiN}$ is equal to the incident wavelength $\lambda_i$ divided by the refraction index of SiN $\lambda_i/1.885=564$ nm. Thus, the lateral dimension of the metallic structures 50 may be substantially equal to half the wavelength in SiN $\lambda_{SiN}$ and the distance L between two adjacent metallic structures 50 can be substantially equal to the wavelength in SiN $\lambda_{SiN}$.

In another embodiment, the plasmonic structure 5 is located at the level of the top metal connector layer MCT.

Figure 6:
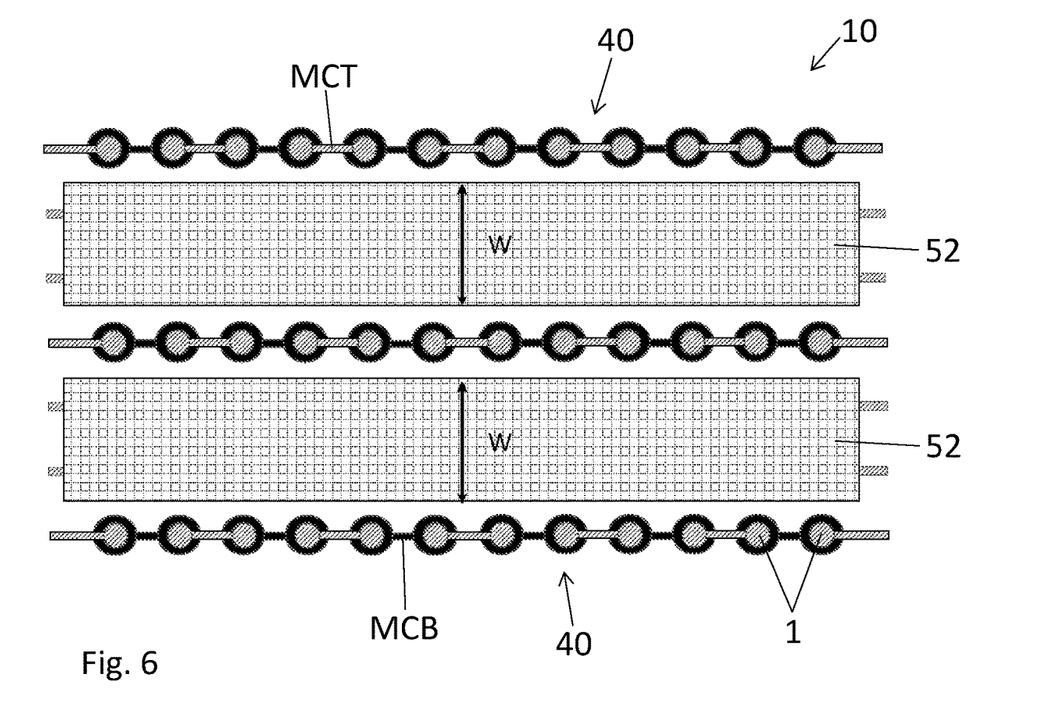
FIG. 6 shows a top view of an arrangement of the magnetic sensor comprising the plasmonic structure located at the level of the top metal connector layer, according to an embodiment.

FIG. 6 shows a top view of an arrangement of the magnetic sensor 10 comprising the plasmonic structure 5 located at the level of the top metal connector layer MCT, i.e. in the plane of the top metal connector layer MCT. The magnetic sensor 10 comprises an array of sensor branches 40, each sensor branch 40 comprising a plurality of interconnected magnetoresistive elements 1. The plasmonic structure 5 can comprise a plurality of plasmonic subarrays 52, wherein each plasmonic subarray 52 comprises a periodic array of metallic structures 51. Each plasmonic subarray 52 can be arranged in alternance with the sensor branches 40.

In one aspect, a plasmonic subarray 52 has a width $W_P$ that is twice the width $W_S$ of a sensor branch 40. In other words, the surface area occupied by the plasmonic subarray 52 corresponds to the surface area of two sensor branches 40. The plasmonic resonance of each plasmonic subarray 52 depends on the periodicity of the array of metallic structures 51 and on the lateral dimension d of the metallic structure 51.

In an example, the plasmonic subarray 52 is about 5.0 μm in width. The lateral dimension d of the metallic structures 51 is about 0.4 μm. However, other arrangements of the plasmonic subarrays 52 relative to the sensor branches 40 can be contemplated.

Other arrangements of the plasmonic structure 5 are also possible. For example, the plasmonic structure 5 can be located at the levels (in the plane) of any one of the metal layers, such as at the levels of the second current line 4 or the metal connector layer MCB. Such arrangements can include a plurality of plasmonic subarray 52 arranged in alternance with the sensor branches 40, as described above.

Configurations of the magnetic sensor 10 where the plasmonic structure 5 is provided in the plane of the top metal connector layer MCT, bottom metal connector layer MCB, or other metal connector layers or metal vias, may result in lowering the density of magnetoresistive elements 1 per area in the magnetic sensor 10. Indeed, the available surface area of the magnetic sensor 10 must be shared between the surface area occupied by the plasmonic structure 5 and the surface area occupied by the magnetoresistive elements 1.

The resonance frequencies were modelled for the plasmonic structure 5 located at the level of the top metal connector layer MCT and arranged according to the configuration shown in FIG. 6. The resonance frequencies were modelled for spatially periodic arrangement of metallic structures 51 having a rectangular shape (see FIG. 4a), a disc shape (see FIG. 4b). The resonance frequencies were modelled for multiple lateral dimension d of the metallic structures 51 and multiple distance L between two adjacent metallic structures 51.

Table 1 reports the plasmonic resonance values obtained from the modelling for the plasmonic structure 5 located at the level of the top metal connector layer MCT. The modelling was performed for the plasmonic array 50 having rectangular-shaped (sq) and disc-shaped (circ) metallic structures 51 being spaced by a distance L between 500 nm and 700 nm and having a lateral dimension d between 200 nm and 300 nm.

TABLE 1

| L/d (nm/nm) | Resonances (sq., μm) | Resonances (circ, μm) |
|---|---|---|
| 500/200 | 1.12; 0.74; 0.66; 0.57; 0.51 | 1.08; 0.75; 0.65; 0.57; 0.5 |
| 600/200 | 1.32; 0.79; 0.7; 0.6 | 1.27; 0.96; 0.67; 0.6; 0.57; 0.52 |
| 500/250 | 0.89; 0.73; 0.63; 0.54 | 1.09; 0.62; 0.6; 0.52; 0.5 |
| 500/300 | 0.95; 0.89; 0.65; 0.6; 0.56; 0.51 | 0.93; 0.71; 0.66; 0.54 |
| 600/300 | 1.27; 0.97; 0.86; 0.69; 0.56; 0.52 | 1.02; 0.75; 0.57; 0.52; 0.51 |
| 700/300 | 0.82; 0.71; 0.75; 0.64; 0.54; 0.5 | 1.49; 1.13; 1.07; 0.84; 0.6; 0.5 |

Table 2 reports the plasmonic resonance values obtained from the modelling for the plasmonic structure 5 located at the level of the bottom metal connector layer MCB. The modelling was performed for the plasmonic array 50 having rectangular-shaped (sq) and disc-shaped (circ) metallic structures 51 being spaced by a distance L between 500 nm and 880 nm and having a lateral dimension d between 200 nm and 400 nm.

Simulations have shown that the resonant absorption can happen both in the metallic structures 51 and in metallic layer beneath, for example, both in the metallic structures 51 and in the top metal connector layer MCT or both in the metallic structures 51 and in the bottom metal connector layer MCB.

Depending on the configuration and of the location of the plasmonic structure 5 in the magnetic sensor 10, reflectance of the electromagnetic radiation 70 emitted by the emitting device 7 can drop below 20%. Frequency corresponds to laser wavelength 1064 nm

TABLE 2

| L/d (nm/nm) | Resonances (sq., μm) | Resonances (circ, μm) |
|---|---|---|
| 500/200 | 0.88; 0.62; 0.53 | 0.83; 0.66; 0.63; 0.53 |
| 600/200 | 0.68; 0.65; 0.55; 0.52 | 0.76; 0.6; 0.54 |
| 500/250 | 0.91; 0.52; 0.5 | 0.66; 0.6; 0.53; 0.52 |
| 500/300 | 0.69; 0.51; 0.5 | 0.61 |
| 600/300 | 0.63; 0.54; 0.51 | 0.74 |
| 700/300 | 1.15; 0.7; 0.63; 0.6; 0.57; 0.5 | 1.15; 0.72; 0.61; 0.53 |
| 880/400 | 0.97; 0.75; 0.67; 0.61; 0.57; 0.54 | 1.38; 1.03; 0.87; 0.6 |

Other configurations of the plasmonic structure 5 can be contemplated. For example, the plasmonic structure 5 can be located at the level of the top metal connector layer MCT and the metallic structures 51 can be spaced by a distance L between 400 nm and 700 nm and have a lateral dimension d between 200 nm and 300 nm.

In another configuration, the plasmonic structure 5 can be located at the level of the bottom metal connector layer MCB and the metallic structures 51 can be spaced by a distance L between 500 nm and 900 nm and have a lateral dimension d between 200 nm and 400 nm.

In yet another configuration, the plasmonic structure 5 is located at the level of the second current line 4 below the MTJ 2 and the metallic structures 51 can be spaced by a distance L between 450 nm and 850 nm and have a lateral dimension d between 200 nm and 450 nm.

For the plasmonic array 50 comprising the rectangular-shaped and disc-shaped metallic structures 51, the simulations have shown that the resonance frequencies are determined by the lateral dimension d and the distance L between adjacent metallic structures 51.

In yet another configuration, the metallic structures 51 can have an elliptical shape (FIG. 4c). For the plasmonic structure 5 comprising the elliptical metallic structures 51, the simulations have shown that the resonance frequencies are determined by the long axis (a) and short axis (b) of the elliptical metallic structures 51. The elliptical metallic structures 51 can have a long axis between 230 nm and 470 nm and a short axis between 470 nm and 230 nm, respectively.

Figure 7:
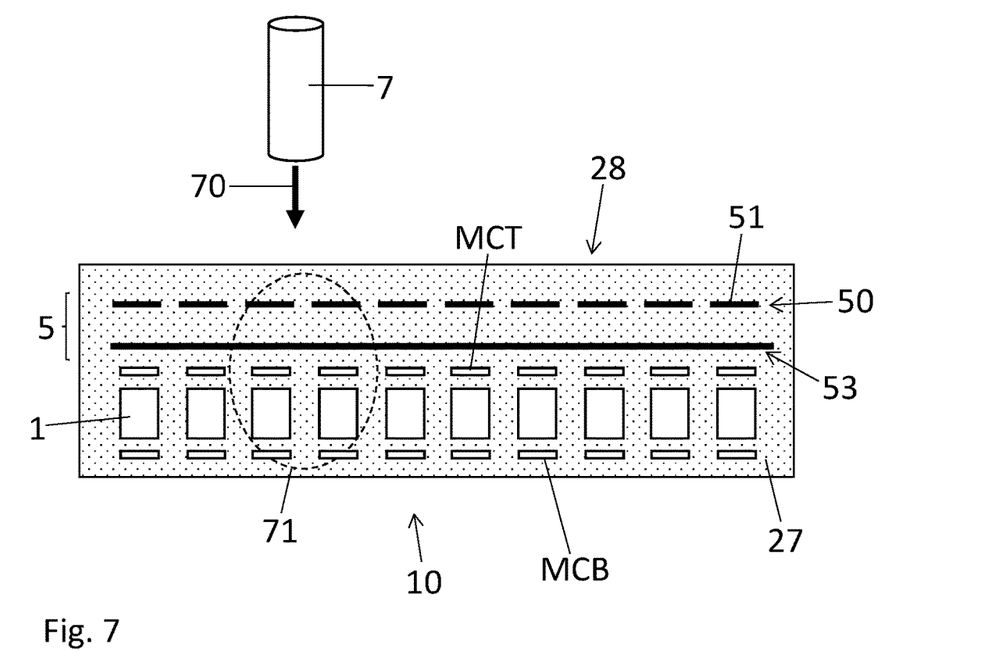
FIG. 7 shows the plasmonic structure comprising a plasmonic array and an auxiliary plasmonic structure, according to an embodiment.

Other configurations of the plasmonic structure 5 can also be considered. In an embodiment shown in FIG. 7, the plasmonic structure 5 comprises the plasmonic array 50 and an auxiliary plasmonic structure 53 configured for adjusting absorption of the electromagnetic radiation energy. In other words, under resonance conditions, the plasmonic array 50 and the auxiliary plasmonic structure 53 resonate simultaneously because of electromagnetic coupling between them. The auxiliary plasmonic structure 53 may result in an amplification of the power absorption by a factor of 3 of even more. The plasmonic array 50 can be comprised between the auxiliary plasmonic structure 53 and the electromagnetic radiation emitting device 7. The auxiliary plasmonic structure 55 can comprise a spatially periodic arrangement of metallic structures or a continuous metallic layer.

Figure 8:
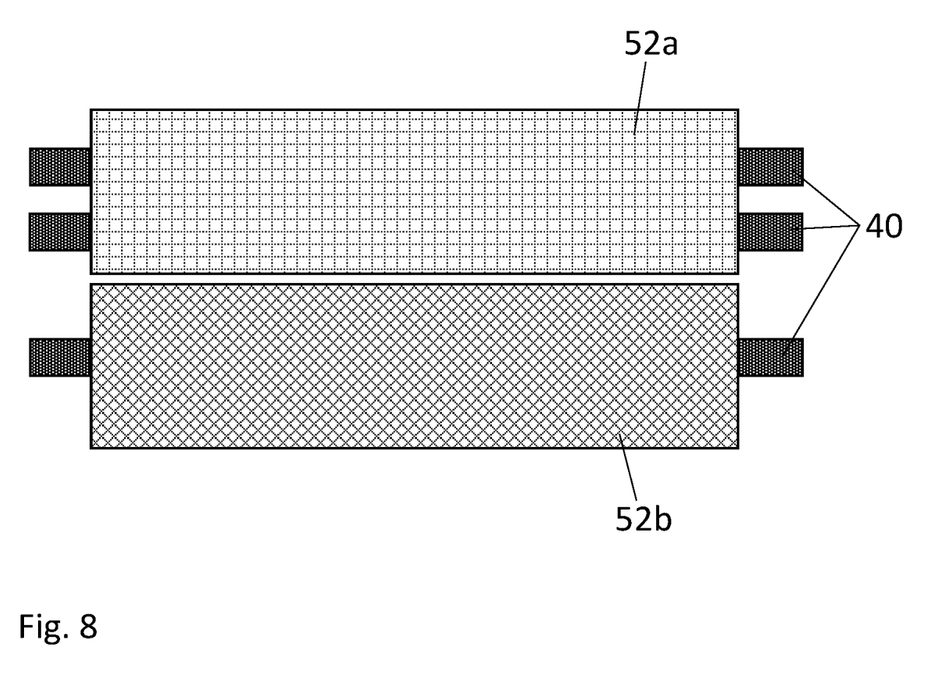
FIG. 8 shows the magnetic sensor wherein the plasmonic structure comprises a first plasmonic subarray and a second plasmonic subarray, according to an embodiment.

In yet another embodiment shown in FIG. 8, the plasmonic structure 5 comprises at least a first plasmonic subarray 52a and a second plasmonic subarray 52b. The first plasmonic subarray 52a is configured to transmit the heat generated by plasmon resonance to a first subset of magnetoresistive elements 1 of the magnetic sensor 10 and the second plasmonic subarray 52b is configured to transmit the heat generated by plasmon resonance to a second subset of magnetoresistive elements 1. In FIG. 8, the first subset is represented as two sensor branches 40 comprising magnetoresistive elements 1 and the second subset comprises one such branch 40. Other configurations of the subsets should be considered as well as of the number of plasmonic subarrays and subsets.

The plasmonic subarrays 52a, 52b can be located on top of the magnetoresistive elements 1 and on top of the top metal connector layer MCT.

The at least first plasmonic subarray 52a has a different resonance response from the second plasmonic subarray 52b with respect to the polarization or wavelength λ of the electromagnetic radiation 70.

The wavelength and/or the polarization of the electromagnetic radiation 70 emitted by the electromagnetic radiation emitting device 7 can be adjusted in order to correspond to the resonant condition of one of the first or second plasmonic subarray 52a, 52b such that plasmon resonance occurs only for one of the first or second plasmonic subarray 52a, 52b. Thus, only the sensor branches 40 corresponding to the resonant plasmonic subarray 52a or 52b are heated at the high temperature threshold.

This latter configuration allows for programming selectively sensor branches 40 without requiring a mask for illumination beam windowing in the case the whole magnetic sensor 10 is completely illuminated. There are also fewer positioning constraints since the electromagnetic radiation emitting device 7 (such as a laser) can be moved over the top surface 28 of the magnetic sensor 10 such as to selectively heat the one or several magnetoresistive elements 1 encompassed by the illuminated region (71).

REFERENCE NUMBERS AND SYMBOLS 1 magnetoresistive element
10 MRAM based sensor
2 magnetic tunnel junction
21 reference layer
210 reference magnetization
22 tunnel barrier layer
23 sense layer
230 sense magnetization
24 pinning layer
27 dielectric layer
28 top surface
3 first current line
4 second current line
40 sensor branch
5 plasmonic structure
50 plasmonic array
51 metallic structure
52 plasmonic subarray
53 auxiliary plasmonic structure
7 electromagnetic radiation emitting device
70 electromagnetic radiation
71 illuminated region
80 front-end circuit
λ wavelength
d lateral dimension
L distance
MCB bottom metal connector layer, field line
MCT top metal connector layer
VM metal via
$W_P$ width of plasmonic substructure
$W_S$ width of sensor branch

The invention claimed is:

1. A magnetic sensor comprising a plurality of magnetoresistive elements; each magnetoresistive element comprising a MTJ including a first ferromagnetic layer having a first magnetization being pinned below a threshold temperature and free at or above the threshold temperature, such that the first magnetization can be switched when first ferromagnetic layer is at the high temperature threshold during a programming operation;
the magnetic sensor further comprising a plasmonic structure destined to be irradiated by electromagnetic radiation, the plasmonic structure comprising a spatially periodic plasmonic array of metallic structures, the period of the plasmonic array and the lateral dimension of the metallic structures being adjusted to obtain plasmon resonance of the plasmonic structure for a given wavelength of the electromagnetic radiation;
wherein the plasmonic array is arranged in the magnetic sensor such as to heat the first ferromagnetic layer at or above the threshold temperature, from the enhanced absorption of the electromagnetic radiation by plasmon resonance;
wherein the magnetic sensor comprises an array of sensor branches, each sensor branch comprising the plurality of magnetoresistive elements;
wherein the plasmonic structure comprises a plurality of plasmonic subarrays, each plasmonic subarray comprising a periodic array of metallic structures and being arranged in alternance with the sensor branches; and
wherein the plasmonic structure comprises at least a first plasmonic subarray and a second plasmonic subarray having a different resonance response from the first plasmonic subarray with respect to the polarization or wavelength of the electromagnetic radiation.

2. The magnetic sensor, according to claim 1, wherein the period of the plasmonic array and the lateral dimension of the metallic structures are adjusted to obtain plasmon resonance of the plasmonic structure, for a given wavelength of the electromagnetic radiation.

3. The magnetic sensor, according to claim 1,
wherein the MTJ is between a top surface and a front-end circuit of magnetic sensor; and
wherein the plasmonic structure is provided between the top surface and the front-end circuit.

4. The magnetic sensor, according to claim 3,
wherein the magnetoresistive element includes a top metal connector layer between the MTJ and the top surface; and
wherein the plasmonic structure is provided in the plane of the top metal connector layer.

5. The magnetic sensor, according to claim 3,
wherein the magnetoresistive element includes a bottom metal connector layer between the MTJ and the front-end circuit; and
wherein the plasmonic structure is provided in the plane of the bottom metal connector layer.

6. The magnetic sensor, according to claim 1,
wherein the plasmonic structure is embedded in a dielectric layer; and
wherein the period of the plasmonic array and the lateral dimension of the metallic structures are adjusted to obtain plasmon resonance of the plasmonic structure, for a given ratio of the wavelength of the electromagnetic radiation to the refractive index of the dielectric layer.

7. The magnetic sensor, according to claim 1, wherein the plasmonic structure further comprises an auxiliary plasmonic structure configured to adjust absorption of the electromagnetic radiation.

8. The magnetic sensor, according to claim 7, wherein the auxiliary plasmonic structure comprises a spatially periodic arrangement of metallic structures or a continuous metallic layer.

9. The magnetic sensor, according to claim 3,
wherein the plasmonic structure further comprises an auxiliary plasmonic structure configured to adjust absorption of the electromagnetic radiation, and
wherein the auxiliary plasmonic structure and the plasmonic array are between the magnetoresistive elements and the top surface.

10. A system comprising:
the magnetic sensor according to claim 1; and
an electromagnetic radiation emitting device configured to emit electromagnetic radiation that irradiates an illuminated region of the magnetic sensor and that has a wavelength adapted to generate plasmon resonance of the plasmonic structure.

11. The system according to claim 10, wherein illuminated region encompasses at least one magnetoresistive element.

12. The system according to claim 10, wherein the electromagnetic radiation emitting device comprises a laser emitting device directing a focused laser beam to the illuminated region of the magnetic sensor.

13. The system according to claim 10, wherein the electromagnetic radiation emitting device is movable over the surface of the magnetic sensor such as to selectively heat the one or several magnetoresistive elements encompassed by the illuminated region.

14. The system according to claim 10,
wherein the plasmonic structure comprises at least a first plasmonic subarray and a second plasmonic subarray having a different resonance response from the first plasmonic subarray with respect to the polarization or wavelength of the electromagnetic radiation; and
wherein the wavelength and/or the polarization of the electromagnetic radiation is adjustable in order to correspond to the resonant condition of one of the first or second plasmonic subarray.

15. The system according to claim 10, wherein the plasmonic array comprises a two-dimensional lattice having substantially equal the distance between two adjacent metallic structures and wherein the plasmonic array comprises any one of a square lattice rectangular lattice, a hexagonal lattice or a rhombic lattice.

\* \* \* \* \*

UNITED STATES PATENT AND TRADEMARK OFFICE
CERTIFICATE OF CORRECTION

| | |
|---|---|
| PATENT NO. | : 12,102,011 B2 |
| APPLICATION NO. | : 17/999578 |
| DATED | : September 24, 2024 |
| INVENTOR(S) | : Andrey Timopheev, Nikita Strelkov and Jeffrey Childress |

Page 1 of 1

It is certified that error appears in the above-identified patent and that said Letters Patent is hereby corrected as shown below:

In the Specification

Column 5, Line 45, delete "MTJs 2." and replace with --MTJ 2.--.

Column 5, Line 63, delete "wavelength 2" and replace with --wavelength $\lambda$--.

Signed and Sealed this
Fourth Day of March, 2025

Coke Morgan Stewart
*Acting Director of the United States Patent and Trademark Office*